(12) United States Patent
Chu et al.

(10) Patent No.: US 7,846,753 B2
(45) Date of Patent: Dec. 7, 2010

(54) VERTICAL LIGHT EMITTING DIODE AND METHOD OF MAKING A VERTICAL LIGHT EMITTING DIODE

(75) Inventors: Hung Shen Chu, Shatin (CN); Yong Cai, Shatin (CN)

(73) Assignee: Hong Kong Applied Science and Technology Research Institute, Hong Kong, Hong Kong (CN)

(*) Notice: Subject to any disclaimer, the term of this patent is extended or adjusted under 35 U.S.C. 154(b) by 355 days.

(21) Appl. No.: 12/058,059

(22) Filed: Mar. 28, 2008

(65) Prior Publication Data

US 2009/0039383 A1 Feb. 12, 2009

Related U.S. Application Data

(63) Continuation-in-part of application No. 11/891,466, filed on Aug. 10, 2007.

(51) Int. Cl.
*H01L 21/00* (2006.01)
(52) U.S. Cl. .............................. 438/24; 438/22; 438/29
(58) Field of Classification Search .............. 438/22, 438/24, 29
See application file for complete search history.

(56) References Cited

U.S. PATENT DOCUMENTS

| | | | |
|---|---|---|---|
| 5,977,565 A | 11/1999 | Ishikawa et al. | |
| 7,501,299 B2 * | 3/2009 | Wong et al. | 438/31 |
| 7,535,100 B2 * | 5/2009 | Kub et al. | 257/728 |
| 7,573,076 B2 * | 8/2009 | Baik et al. | 257/103 |
| 2004/0115849 A1 * | 6/2004 | Iwafuchi et al. | 438/25 |
| 2006/0255341 A1 * | 11/2006 | Pinnington et al. | 257/79 |

FOREIGN PATENT DOCUMENTS

| CN | 1510765 | 7/2004 |
|---|---|---|
| JP | 2007/158334 | 6/2007 |

OTHER PUBLICATIONS

International Search Report, Sep. 25, 2008.

* cited by examiner

*Primary Examiner*—Luan C Thai
(74) *Attorney, Agent, or Firm*—Venable LLP; Jeffri A. Kaminski; Todd R. Farnsworth

(57) ABSTRACT

A vertical gallium-nitrate-based LED and method of making a vertical gallium-nitrate-based LED using a stop layer is provided. Embodiments of the present invention use mechanical thinning and a plurality of superhard stop points to remove epitaxial layers with a high level of certainty. According one embodiment, the method of making a vertical LED includes forming a plurality of layers on a sapphire substrate, forming a plurality of stop points in the plurality of layers, removing the sapphire substrate and part of a u-GaN layer using mechanical thinning, wherein the mechanical thinning stops at an end of the plurality of stop points, selectively etching the u-GaN layer and exposing at least a part of the highly doped stop layer, and forming an n-electrode on the highly doped stop layer.

11 Claims, 10 Drawing Sheets

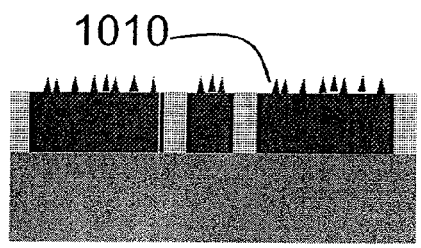
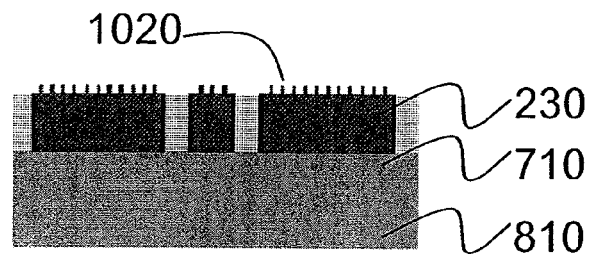
FIG. 9A          FIG. 9B
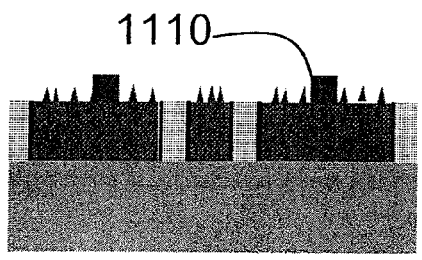
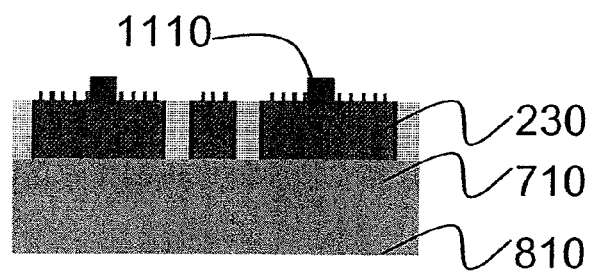
FIG. 10A         FIG. 10B
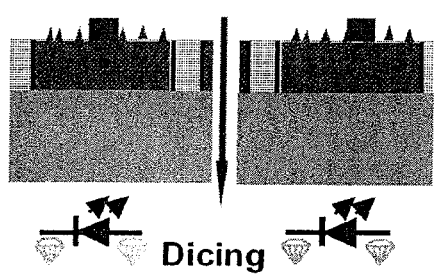
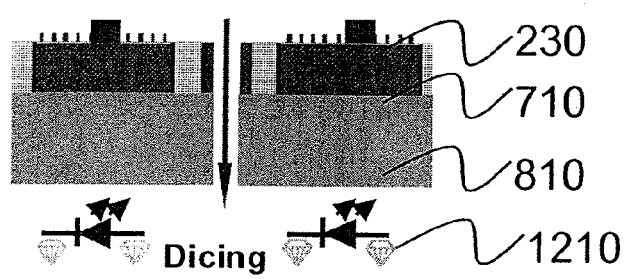
FIG. 11A         FIG. 11B

VERTICAL LIGHT EMITTING DIODE AND METHOD OF MAKING A VERTICAL LIGHT EMITTING DIODE

CROSS-REFERENCE TO RELATED APPLICATIONS

This application is a continuation-in-part of U.S. patent application Ser. No. 11/891,466, filed on Aug. 10, 2007, the disclosure of which is incorporated fully by reference.

FIELD OF THE INVENTION

The present invention relates to a vertical light emitting diode (LED), and more particularly, to a vertical gallium-nitride (GaN)-based LED and method of making a vertical GaN-based LED using a stop layer.

BACKGROUND OF THE INVENTION

Semiconductors that contain nitrogen (N) as the Group V element have proven to be useful for short-wavelength light emitting devices because of their wide band gap. Among these, extensive research has been conducted on gallium-nitride based semiconductors for use as light emitting diodes, such as AlGaInN, and such light emitting diodes (LED) have already been put to practical use.

Generally, GaN-based LED are grown on a sapphire substrate. The sapphire substrate is rigid and electrically nonconductive and has a low thermal conductivity. In a typical process for making a GaN-based LED, an undoped GaN layer and a lightly doped n-type GaN layer are sequentially grown on a sapphire substrate. A heavily doped n-type GaN layer, an active layer with a multi-quantum well structure, and a p-type GaN layer are also sequentially grown on the lightly doped n-type GaN layer. One or more p-electrodes may then be formed on the p-type GaN layer. The sapphire substrate is removed using a laser lift off (LLO) process, exposing the n-type layers for subsequent etching and removal such that the n-type electrode contacts the lightly doped n-type GaN layer.

However, the known methods of manufacturing vertical GaN-based LEDs have limitations in that the LLO process can be inadequate and inefficient for manufacturing reliable, efficient LED. Also, due to the similar etching selectively of the various GaN layers, it can be difficult to differentiate the interface between the different layers. Accordingly, there is a need for a vertical LED and method of making a vertical LED that solves the shortcomings of known methods.

SUMMARY OF THE INVENTION

According to one embodiment of the present invention, a vertical gallium-nitride (GaN)-based light emitting diode (LED) is disclosed. The vertical GaN-based LED includes a conductive substrate; a p-type GaN layer formed on the conductive substrate; an active layer formed on the p-type GaN layer; an n-type GaN layer formed on the active layer; a highly doped stop layer formed on the n-type GaN; a plurality of stop points, wherein a p-type GaN layer, the active layer, the n-type GaN layer, and the highly doped stop layer are a plurality of layers, and the plurality of stop points are formed in the plurality of layers; and an n-electrode formed on the highly doped stop layer.

According to another embodiment of the present invention, a vertical gallium-nitride (GaN)-based light emitting diode (LED) is disclosed. The vertical GaN-based LED includes a conductive substrate; a p-type GaN layer formed on the conductive substrate; an active layer formed on the p-type GaN layer; an n-type GaN layer formed on the active layer; a highly doped stop layer formed on the n-type GaN, wherein the highly doped stop layer is an AlN/GaN super lattice structure including one or more pairs of AlN and GaN layers; and a plurality of stop points, wherein a p-type GaN layer, the active layer, the n-type GaN layer, and the highly doped stop layer are a plurality of layers, and the plurality of stop points are formed in the plurality of layers.

According to yet another embodiment of the present invention, a method of making a vertical GaN-based LED is disclosed. The method includes the steps of providing a sapphire substrate; sequentially forming a u-GaN layer, a highly doped stop layer, an n-type GaN layer, an active layer, and a p-type GaN layer on a sapphire substrate, wherein the u-GaN layer, a highly doped stop layer, an n-type GaN layer, an active layer, and a p-type GaN layer are a plurality of layers; forming a plurality of stop points in the plurality of layers; forming a conductive substrate on the p-type GaN layer; removing the sapphire substrate using a mechanical thinning process; removing a part of the u-GaN layer using mechanical thinning, wherein the mechanical thinning stops at an end of the plurality of stop points; selectively etching the u-GaN layer and exposing at least a part of the highly doped stop layer; removing the u-GaN layer; and forming an n-electrode on the highly doped stop layer.

Still other embodiments of the present invention will become readily apparent to those skilled in the art from the following detailed description, wherein embodiments of the invention are described by way of illustration. As will be realized, the invention is capable of other and different embodiments and its several details are capable of modifications in various respects, all without departing from the spirit and the scope of the present invention.

BRIEF DESCRIPTION OF THE DRAWINGS

FIG. 9A is a cross-sectional view of the semiconductor structure after roughening an active region surface, according to an embodiment of the present invention.

FIG. 9B is a cross-sectional view of the semiconductor structure after forming a two-dimensional photonic crystal on the active region surface, according to an embodiment of the present invention.

FIG. 10A is a cross-sectional view of forming a second electrode to the semiconductor structure shown in FIG. 9A, according to an embodiment of the present invention.

FIG. 10B is a cross-sectional view of forming the second electrode to the semiconductor structure shown in FIG. 9B, according to an embodiment of the present invention.

FIG. 11A is a cross-sectional view of cutting the semiconductor structure light emitting device of FIG. 10A, according to an embodiment of the present invention.

FIG. 11B is a cross-sectional view of cutting the semiconductor structure light emitting device of FIG. 10B, according to an embodiment of the present invention.

DETAILED DESCRIPTION

In the following description, reference is made to the accompanying drawings where, by way of illustration, specific embodiments of the invention are shown. It is to be understood that other embodiments may be used as structural and other changes may be made without departing from the scope of the present invention. Also, the various embodiments and aspects from each of the various embodiments may be used in any suitable combinations. Accordingly, the drawings and detailed description are to be regarded as illustrative in nature and not as restrictive.

Generally, the present invention is directed to a vertical GaN-based LED and to a method of making a vertical GaN-based LED. In one embodiment, the vertical GaN-based LED is made using a stop layer. FIGS. 3 to 11B are directed generally to a mechanical thinning method, such as grinding, lapping, polishing, and/or chemical mechanical polishing, used in a semiconductor fabrication process, such as the manufacture of LED, using super-hard stopping points. FIGS. 12 to 17 illustrate the method of making a vertical GaN-based LED, according to an embodiment of the present invention. In one embodiment, the vertical GaN LED can be made using an application of the mechanical thinning method described with reference to FIGS. 3 to 11B, using stop points. However, those skilled in the art will appreciate that other methods may be used without departing from the scope of the present invention. FIGS. 19 to 23, therefore, illustrate a method of making a vertical GaN-based LED, according to a second embodiment of the present invention, where the stop points are not used.

Throughout the descriptions, use of the prefix "u-" stands for undoped or lightly doped, "p-" stands for p-type or positive, and "n-" stands for n-type or negative.

Figure 1:
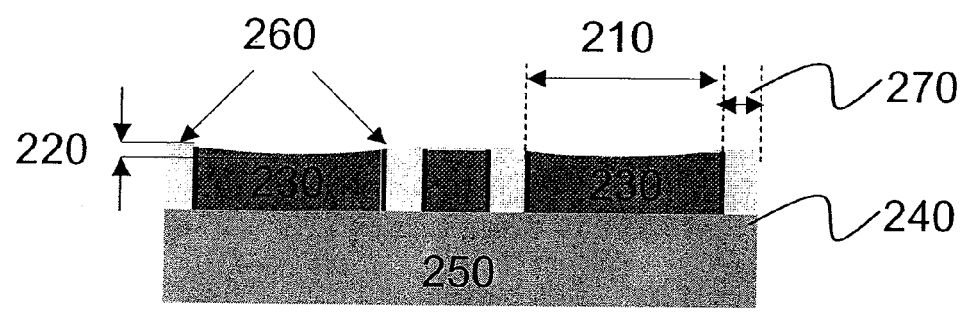
FIG. 1 is a cross-sectional view of a sample semiconductor structure after applying super flat chemical mechanical polishing technology, according to an embodiment of the present invention.

FIG. 1 shows a cross-sectional view of an sample semiconductor structure having a plurality of stop points 260. The semiconductor may also be referred to as "the plane" or "the entire plane" as LED are generally manufactured using a semiconductor structure having a planar shape. The semiconductor structure has a distance 210 between two stop points 260, variable V 220, active regions 230, which may be the light emitting surface of an LED, an electrode layer 240, and a carrier 250. Each stop point has a stop point width 270. After using the mechanical thinning method, such as a super flat chemical mechanical polishing method, having had planted a plurality of stop points 260, the variable V of the entire plane can be controlled within standards required in the semiconductor fabricating process.

In a conventional semiconductor structure, when applying a conventional mechanical thinning technology, if the plane to be polished is very large, the variation in the thickness of the layer, shown as variable V in FIG. 1, will be too large for useful, practical application. The variable V is proportional to the distance between the edges of the plane. As shown in FIG. 1, the stop points 260 act as edges of the plane, so that the variable V is reduced, even though the overall size of the plane is larger.

According to one embodiment, the method of creating stop points comprises the following steps: (a) providing a first material for forming a first layer; (b) providing a second material for forming a second layer on a side of the first layer; (c) etching the second layer for producing a plurality of trenches exposing the surface of the first layer; (d) filling the plurality of trenches with a third material that has a hardness greater than the first material and the second material, the filled trenches forming a plurality of polishing stop points; (e) removing any of the third material that lies outside the trenches, and exposing the surface of the second layer. Therefore, the present embodiment allows later removal of the first material while controlling the variable V to be within standards and limits required in the semiconductor fabricating process.

Figure 2:
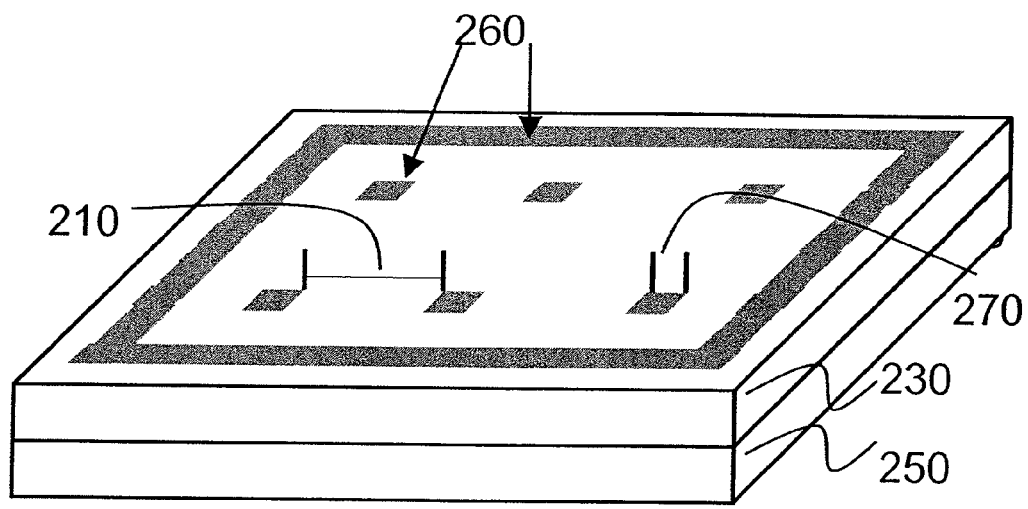
FIG. 2 is an inclined top view of a stop point distribution in the sample semiconductor structure, according to an embodiment of the present invention.

FIG. 2 shows an inclined top view of a stop point distribution, according to one embodiment the present invention. As described above, the variable V can be reduced by using stop points. Therefore, a variable V within an acceptable range can be obtained by controlling sizes of the stop points and/or the distance between the stop points. While the stop points are shown in FIG. 2 as generally square or in the form of perimeter lines, the stop points in the present invention can be any shape, such as lines, dots, circles, triangles, or rectangles, and may be located in any suitable positions on the plane.

Figure 3:
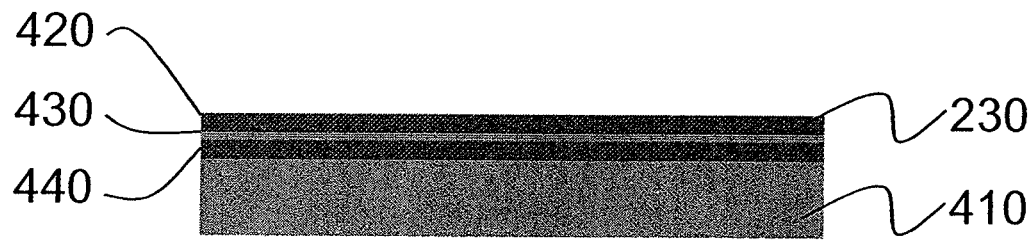
FIG. 3 is a cross-sectional view of a semiconductor structure, according to an embodiment of the present invention.
Figure 4:
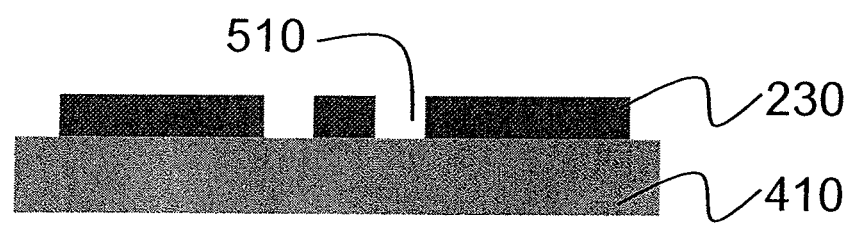
FIG. 4 is a cross-sectional view of the semiconductor structure after etching, according to an embodiment of the present invention.
Figure 5:
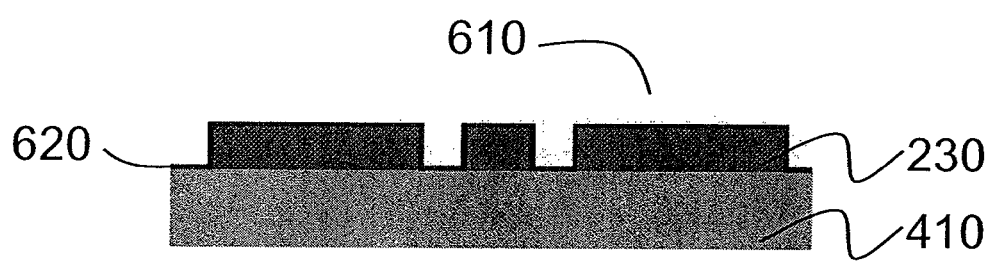
FIG. 5 is a cross-sectional view of the semiconductor structure after being covered with diamond film, according to an embodiment of the present invention.
Figure 6:
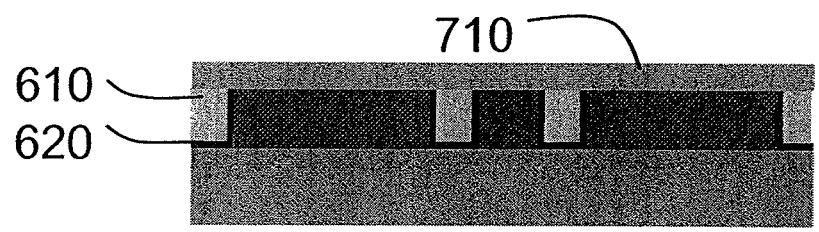
FIG. 6 is a cross-sectional view of the semiconductor structure after forming a first electrode layer, according to an embodiment of the present invention.
Figure 7:
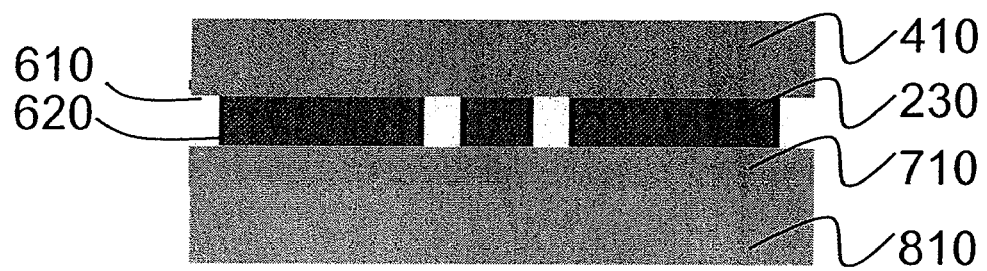
FIG. 7 is a cross-sectional view of the semiconductor structure after bonding a conductive carrier to the first electrode layer, according to an embodiment of the present invention.
Figure 8:
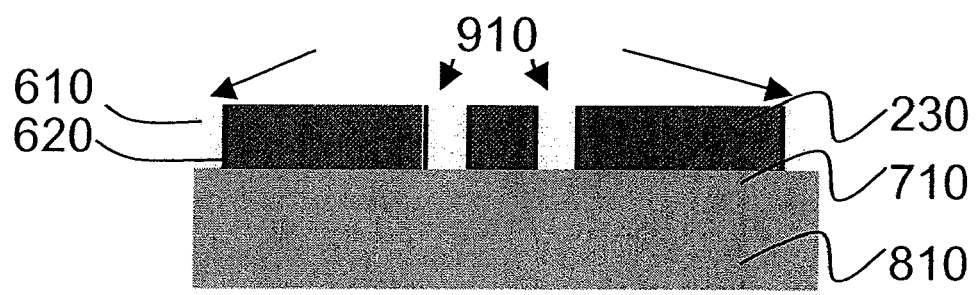
FIG. 8 is a cross-sectional view of the semiconductor structure after mechanical thinning process, according to an embodiment of the present invention.

An application of the present invention, according to an embodiment, is disclosed in FIGS. 3 to 11B, which is a method of fabricating a film semiconductor light emitting device. The method comprises the following steps: (a) providing a first material for forming a first layer 410; (b) providing a second material of a semiconductor material, for forming a second layer 230 acting as an active region on a side of the first layer (as shown in FIG. 3, the second material may include multiple layers, for example one or more p-GaN layers 420, an active layer having multiple quantum wells 430, and one or more n-GaN layers 440); (c) etching the second layer for producing a plurality of trenches 510 and exposing surfaces of the first layer (as shown in FIG. 4); (d) covering a layer medium 620; (e) adding a third material 610, which has hardness greater than the first material and the second material, which also fills in the trenches to form a plurality of stop points (as shown in FIG. 5); (f) removing the third material 610 and the layer medium 620, removing the third material in areas outside of the trenches so that only the stop points 910 (shown in FIG. 8) remain, and providing a fourth material for forming a first electrode layer 710 on surfaces of the second layer (as shown in FIG. 6); (g) bonding the first electrode layer on a conductive carrier 810 (as shown in FIG. 7); (h) removing the first layer exposing a plurality of stop points 910 (as shown in FIG. 8); and (i) forming a plurality of second electrodes 1110 on surfaces of the second material after removing the first layer (as shown in FIG. 10). The present embodiment further comprises roughening the light emitting surfaces 1010 as in FIG. 9A or forming two-dimensional photonic crystal 1020 on the light emitting surfaces as in FIG. 9B. Finally, as shown in FIG. 11A or FIG. 11B, cutting to form the light emitting device can be performed. In the embodiment described above, the first material may be sapphire; the second material can be GaN or GaInN, the second material semiconductor material of Group III-V; the etching in step (c) may be inductively coupled plasma etching; wherein the third material can be diamond film or diamond like carbon (DLC) film; the removing in step (h) may be by a mechanical thinning method; the first electrode layer is p-type and the second electrode layer is n-type. An embodiment of the present invention is a diamond shoulder light emitting diode referred to by reference number 1210.

The semiconductor device structure produced according to embodiments of the present invention comprises: a conductive carrier; a semiconductor material layer; a superhard material, wherein the superhard material has at least a surface adjacent to the semiconductor material layer; a first electrode layer located on a first surface of the semiconductor material layer; and a second electrode layer located on a second surface of the semiconductor material layer opposing the first electrode layer. The semiconductor material layer, for example, may be one of InGaP, AlInGaN, AlInGaP, AlGaAs, GaAsP, InGaAsP, or other suitable materials. The superhard material may be, for example, diamond, diamond like carbon (DLC), titanium nitride (TiNx), titanium tungsten (TiWx) alloy, or other suitable materials. The conductive carrier may be, for example, copper, silicon, silicon carbide, gallium arsenide (GaAs), or other similar materials.

Figure 12:
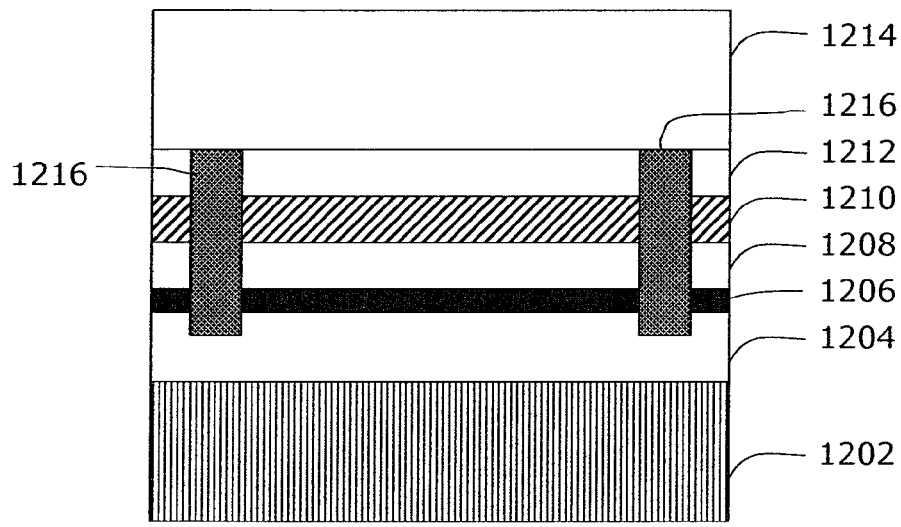
FIG. 12 is a cross-sectional view illustrating the making of a light emitting device, according to an embodiment of the present invention.

FIG. 12 is a cross-sectional view illustrating the making of a light emitting device, according to one embodiment of the present invention. The cross-sectional view of the LED shows a sapphire substrate 1202, an undoped, or lightly doped, u-GaN layer 1204 grown on the sapphire substrate 1202, one or more highly doped n-type AlInGaN stop layers 1206, an n-type GaN layer (n-GaN) 1208, an active layer having a multiple quantum well (MQW) structure 1210, a p-type GaN (p-GaN) layer 1212, and a conductive substrate 1214 to which a p-electrode may be contacted. Stop points 1216 are also shown, which may be created using the method described with reference to FIGS. 3 to 11B. According to one embodiment of the invention, the u-GaN layer has a doping concentration of less than 1e1017 (1/cm$^3$) and the highly doped stop layer has a doping concentration of greater than 1e1017 (1/cm$^3$).

Generally, the light emitting device show is made as follows: An undoped u-GaN layer 1204, or lightly doped GaN layer, is grown on a sapphire substrate 1202. Then, the heavily doped n-type stop layer, such as AlInGaN 1206, the n-GaN layer 1208, and the active layer 1210 are grown on the u-GaN layer 1204. Then, one or more p-GaN layers 1212 are grown on the active layer 1210.

After the one or more p-GaN layers 1212 are grown on the active layer 1210, the stop points 1216 may be formed according to the method described above with reference to FIGS. 3 to 11B. In summary, etching is performed to create trenches, or points, in the semiconductor layers. In one embodiment, the trenches may be formed by mesa isolation. Other methods and techniques for creating the stop points will be appreciated by those of skill in the field. The trenches or points are then filed will a superhard material and the excess material, other than that in the trenches or points, is removed.

Subsequent to creating the stop points 1216, one or more conductive substrates 1214, or one or more p-electrodes of suitable type, may be formed on the p-GaN layer 1212.

Figure 13:
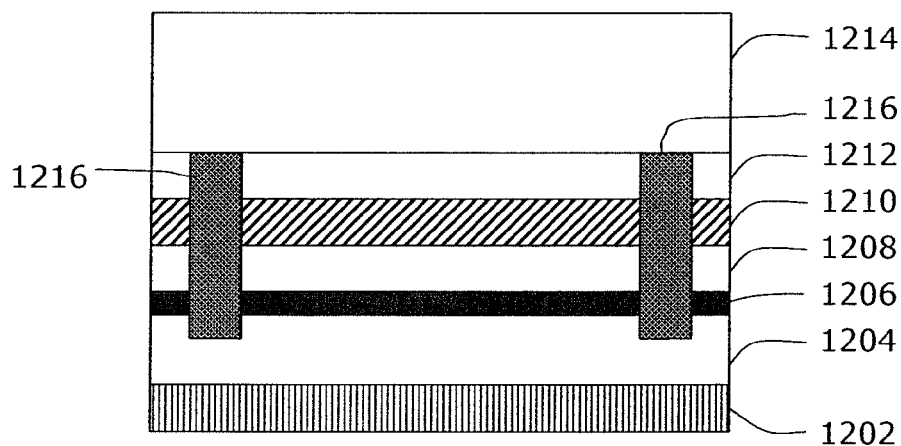
FIG. 13 is a cross-sectional view further illustrating the making of a light emitting device, according to an embodiment of the present invention.

FIG. 13 is a cross-sectional view diagram further illustrating the method of making a light emitting device, according to one embodiment of the present invention. FIG. 13 shows part of the sapphire substrate 1202 having been partially removed. In one embodiment, the sapphire substrate 1202 is removed by a mechanical thinning process, which generally may include grinding, lapping, polishing or chemical mechanical polishing of the surface as part of the process. Other removal methods may be used. However, using a mechanical thinning method in combination with embodiments of the present invention provides added advantages of speed and accuracy.

Figure 14:
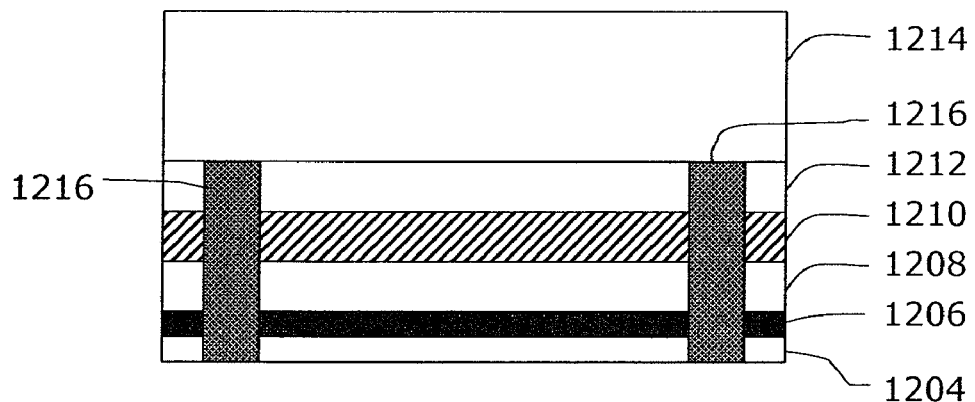
FIG. 14 is a cross-sectional view further illustrating the making of a light emitting device, according to an embodiment of the present invention.

FIG. 14 is a cross-sectional view further illustrating the making of a light emitting device, according to an embodiment of the present invention. In FIG. 14, the entire sapphire substrate 1202 has been removed and part of the u-GaN layer 1204 has also been removed by mechanical thinning. As illustrated in FIG. 14, the removal by CMP stops at the ends of the stop points 1216. As the stop points 1216 are formed from a superhard material, mechanical thinning can be stopped with certainty and precision at the location of the stop points 1216, leaving part of the u-GaN layers. The superhard material may be any suitable material harder than the sapphire substrate and the u-GaN layer. Examples of suitable superhard material are provided with reference to FIGS. 3 to 11B. However, the term "superhard" is not meant to be limited to the examples given but may be any type of material suitable for accomplishing the described method.

Figure 15:
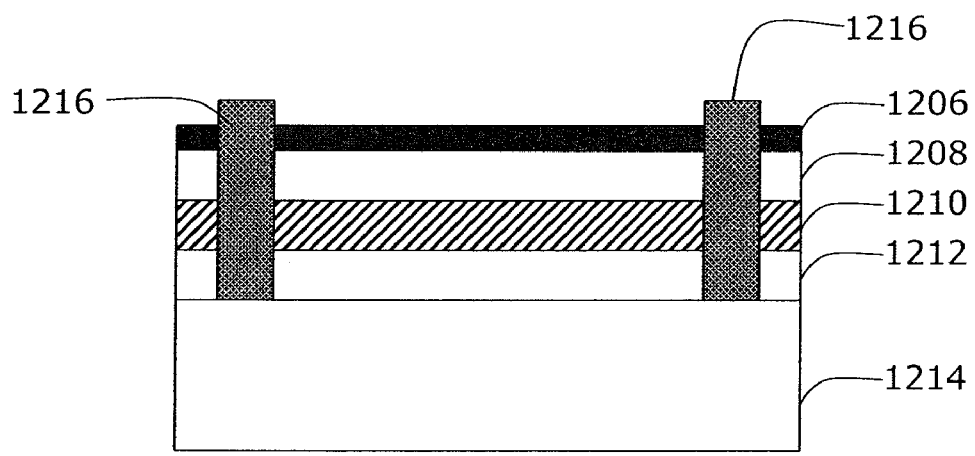
FIG. 15 is a cross-sectional view further illustrating the making of a light emitting device, according to an embodiment of the present invention.

FIG. 15 is a cross-sectional view further illustrating the making of a light emitting device, according to an embodiment of the present invention. From the view of FIG. 14, the image has been rotated 180° such that the conductive substrate 1214 now appears at the lower part of the figure. In FIG. 15, the remaining part of the u-GaN layer 1204 that was not removed during mechanical thinning has been removed by etching. In one embodiment, highly selective wet etching will be used, however dry etching and other suitable etching methods as known by those of skill in the field may also be used. In the illustrated embodiments, the etching is terminated at the stop layer 1206.

According to one embodiment, the AlInGaN stop layer 1206 has the property of $Al_xIn_yGa_{(1-x-y)}N$. In one embodiment, x is less than or equal to approximately 0.35. In another embodiment, x is less than or equal to approximately 0.4. In another embodiment, x may be in a range of 0.2 to 0.5. In one embodiment, y is less than or equal to approximately 0.1. In another embodiment, y is less than or equal to approximately 0.2 or within a range of 0.05 to 0.25. However, other suitable values and other ranges for the values of x and y may be used. According to another embodiment, the stop layer 1206 may be a highly doped AlGaN layer having the property $Al_xGa_{(1-x)}N$ layer. One possible thickness of the AlGaN layer may be less than 0.2 μm. In another embodiment, thickness of the AlGaN layer may equal to approximately 0.2 μm. In one embodiment, the layer thickness should be thin enough for n-doping into the AlN layer. If a thicker $Al_xGa_{(1-x)}N$ layer is used as the stop layer, then the Al mole fraction should be less than approximately 0.35 in order to make for more easier doping of Si into the AlGaN layer.

The stop layer provides for high etching selectivity. One method of high etching selectivity uses photo-electrochemical (PEC) wet etching, which is a high bandgap-dependent etching selectivity. PEC etching is the photo-generation of electron hole pairs, which enhances the oxidation and reduction reaction in an electrochemical reaction.

The stop layer 1206 may also have a super lattice structure, as further described with reference to FIG. 18.

Figure 16:
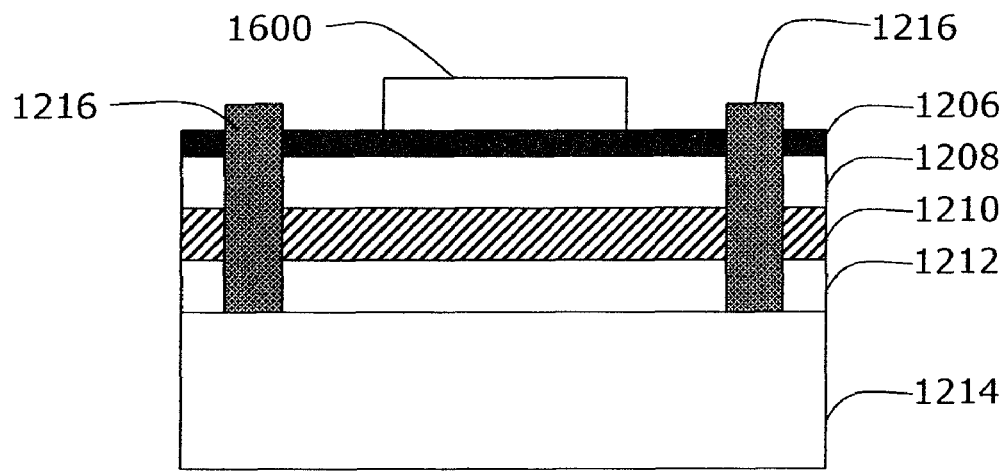
FIG. 16 is a cross-sectional view further illustrating the making of a light emitting device, according to an embodiment of the present invention.

FIG. 16 is a cross-sectional view further illustrating the making of a light emitting device, according to an embodiment of the present invention. An n-electrode 1600 may be fabricated directly onto the stop layer 1206. In one embodiment, fabricating the n-electrode 1600 directly onto the highly doped stop layer 1206 provides the advantage of being able to form the Ohmic contact directly on the highly doped stop layer 1206, thereby achieving a secure contact resistance of the n-electrode to the LED. With the highly doped layer, the contact resistance is lower, and therefore, the operating voltage is lower, resulting in a higher efficiency LED having improved light output.

Figure 17:
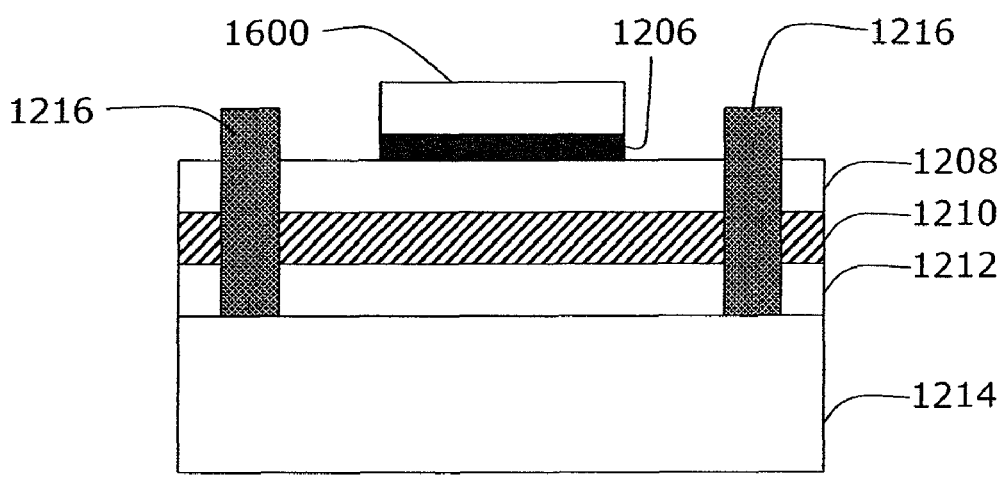
FIG. 17 is a cross-sectional view further illustrating the making of a light emitting device, according to an embodiment of the present invention.

FIG. 17 is a cross-sectional view further illustrating the making of a light emitting device, according to an embodiment of the present invention. In one embodiment, the remaining portion of the stop layer 1206 that doesn't contact the n-electrode 1600 may further be removed by etching or other suitable removal process. However, the stop layer 1206 may also remain and not be removed, according to the specific requirements of the particular application of the LED. Removal of the remaining portions of the stop layer 1206 may reduce the amount of radiation that is absorbed by the stop layer 1206, thereby reducing the amount of impurity that is trapped in the highly doped layer.

Generally, it can be difficult to know the thickness of the u-Gan layer, and also difficult to know with certainty the interface, or junction, between u-GaN and n-type layers. Accordingly, in known fabrication methods, such above-described etching into the u-GaN layer and fabricating the n-electrode directly to the highly doped stop layer has proven difficult, costly, and/or not possible using known methods. Therefore, embodiments of the present invention provide for the removal of the u-GaN layer with certainty, knowing with the required degree of certainty where the sapphire substrate removal should be stopped.

Figure 18:
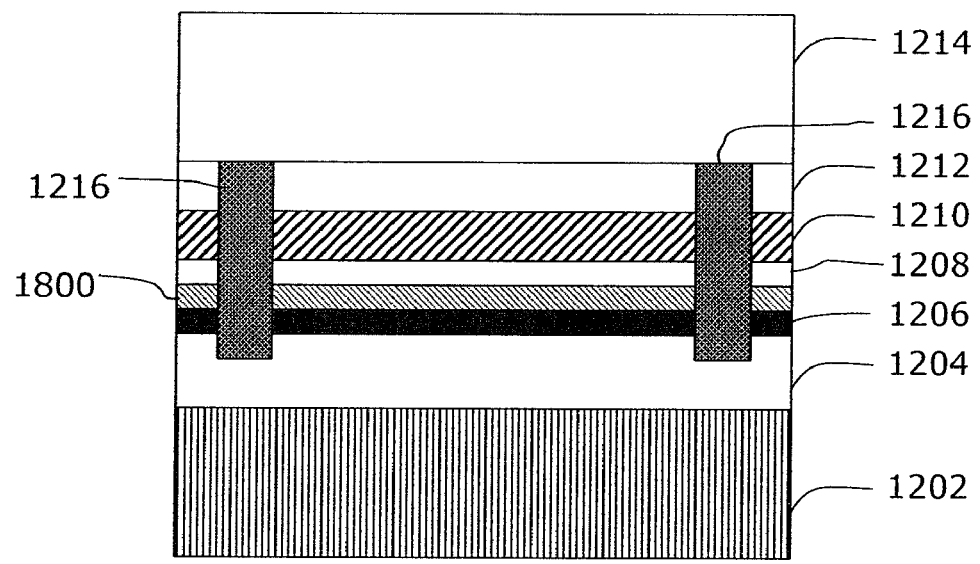
FIG. 18 is a cross-sectional view of a semiconductor structure illustrating an AlN/GaN super lattice structure, according to an embodiment of the present invention.

FIG. 18 is a cross-sectional view of a semiconductor structure illustrating an AlN/GaN super lattice structure, according to an embodiment of the present invention. The cross-sectional view of the LED shows a sapphire substrate 1202, an undoped, or lightly doped, u-GaN layer 1204 grown on the sapphire substrate 1202, a super lattice stop layer comprising a GaN layer 1206 and an AlN layer 1800, which together form an AlN/GaN super lattice (~30 Å/30 Å) stop layer, an n-type GaN layer (n-GaN) 1208, an active layer having a multiple quantum well (MQW) structure 1210, a p-type GaN (p-GaN) layer 1212, and a conductive substrate 1214 to which a p-electrode may be contacted.

The super lattice structure is formed by adjacent layers of AlN and GaN. The super lattice structure may comprise any desired number of pairs of AlN and GaN.

Figure 19:
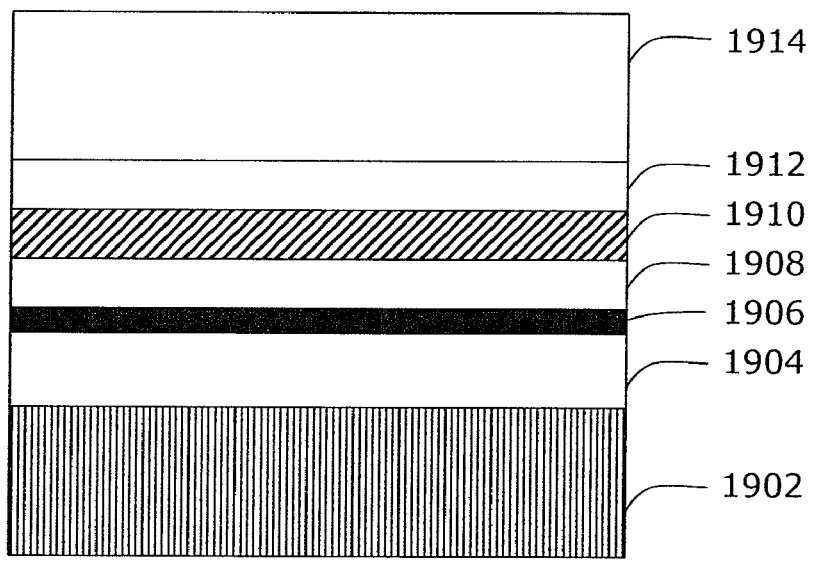
FIG. 19 is a cross-sectional view illustrating the making of a light emitting device, according to a second embodiment of the present invention.

FIG. 19 is a cross-sectional view illustrating the making a light emitting device, according to a second embodiment of the present invention. The method described with reference to FIGS. 19 to 24 are similarly carried out as described with reference to FIGS. 12 to 17, the various layers having similar properties and the similar methods of removal and etching being used. Variations in the embodiment are shown and described with reference to FIGS. 19 to 24 are specifically provided.

Figure 20:
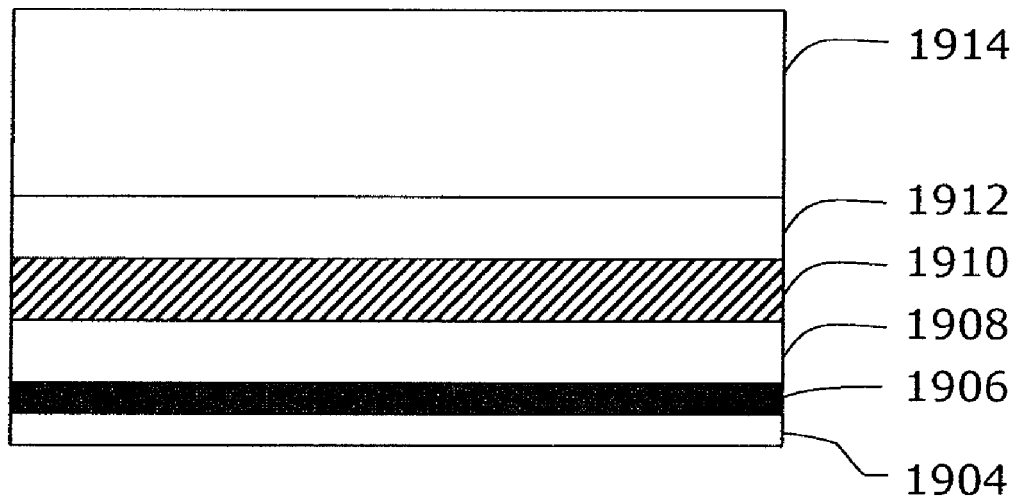
FIG. 20 is a cross-sectional view further illustrating the making of a light emitting device, according to the second embodiment of the present invention.

Referring first to FIG. 19, the cross-sectional view of the LED shows a sapphire substrate 1902, an undoped, or lightly doped, u-GaN layer 1904 grown on the sapphire substrate 1902, one or more highly doped AlInGaN stop layers 1906, an n-type GaN layer (n-GaN) 1908, an active layer having a multiple quantum well (MQW) structure 1910, a p-type GaN (p-GaN) layer 1912, and a conductive substrate 1914 to which a p-electrode may be contacted. As distinguished from the embodiment described with reference to FIGS. 12 to 17, stop points are not included in the semiconductor fabrication method, according to the embodiment described with reference to FIGS. 19 to 24. Referring now to FIG. 20, the entire sapphire substrate 1902 has been removed and part of the u-GaN layer 1904 has also been removed by a mechanical thinning process. Removal of the sapphire substrate 1902 and part of the u-GaN layer 1904 may also be performed by other methods. Identification of the thickness of the various layers may be known, and therefore, by proper measurement and monitoring during production, the appropriate point to stop mechanical thinning can be determined.

Figure 21:
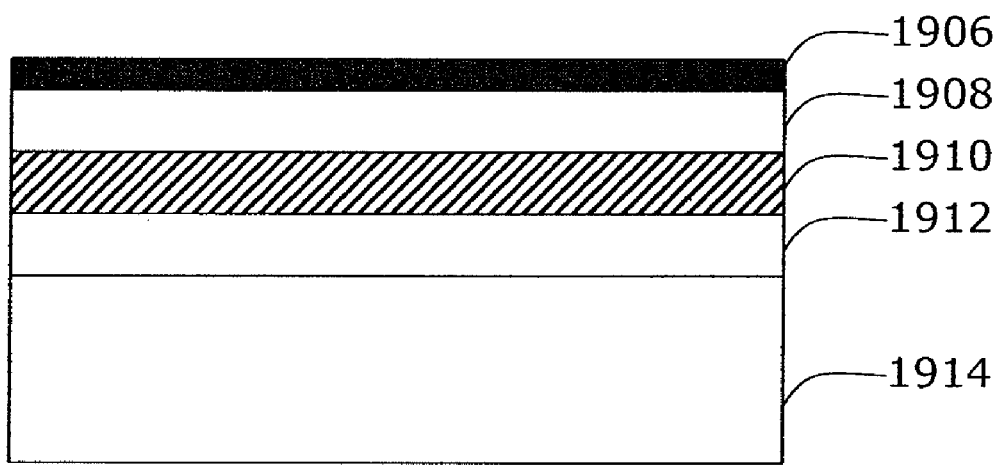
FIG. 21 is a cross-sectional view further illustrating the making of a light emitting device, according to the second embodiment of the present invention.
Figure 22:
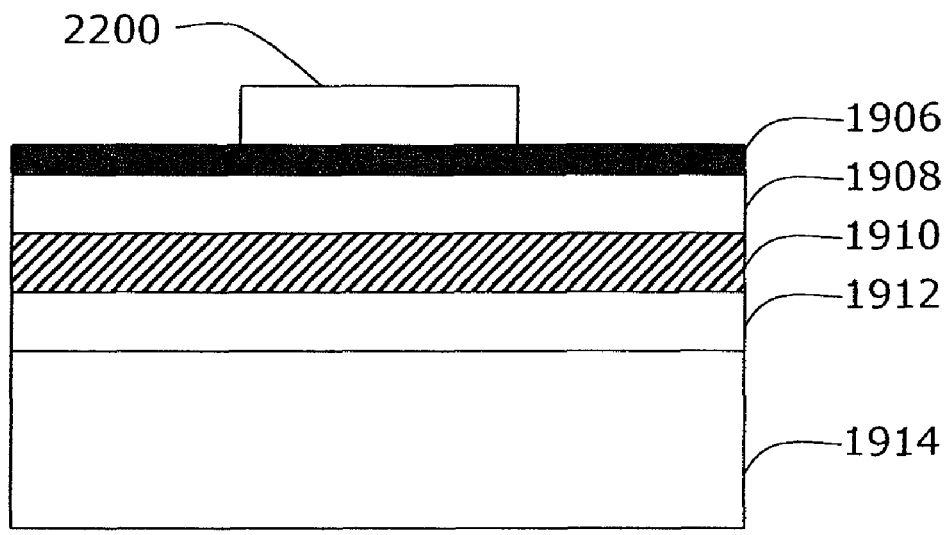
FIG. 22 is a cross-sectional view further illustrating the making of a light emitting device, according to the second embodiment of the present invention.
Figure 23:
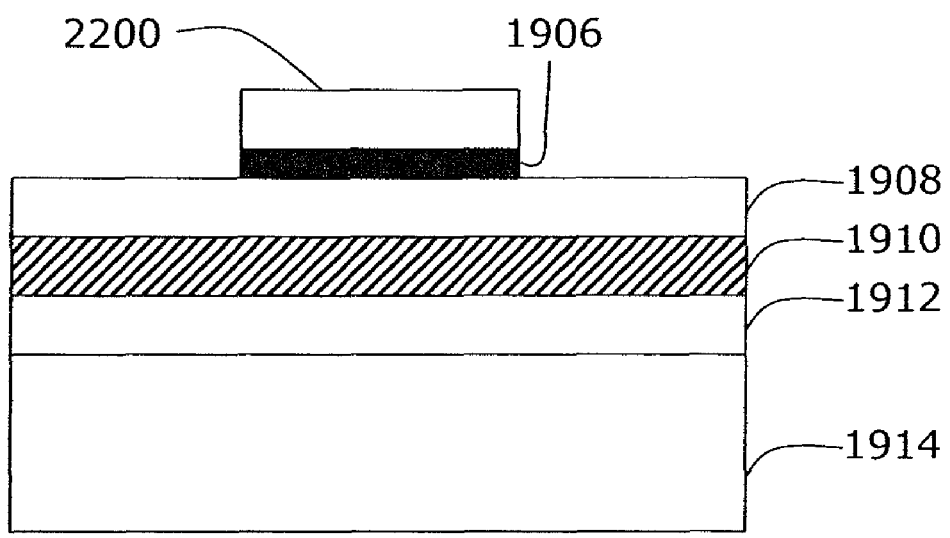
FIG. 23 is a cross-sectional view further illustrating the making of a light emitting device, according to the second embodiment of the present invention.

Referring to FIG. 21, which has been rotated 180° when compared to the view of FIG. 20, such that the conductive substrate 1914 now appears at the lower part of the figure, the remaining part of the u-GaN layer 1904 that was not removed during CMP has been removed by etching. In one embodiment, highly selective wet etching will be used, however dry etching and other suitable etching methods as known by those of skill in the field may also be used. In illustrated embodiments, the etching is terminated at the stop layer 1906. Referring to FIG. 22, an n-electrode 2200 may be fabricated directly onto the stop layer 1906. Referring to FIG. 23, the remaining portion of the stop layer 1906 that doesn't contact the n-electrode 2200 may further be removed by etching or other removal process. However, the stop layer 1906 may also remain and not be removed, according to the specific requirements of the particular application of the LED.

While the invention has been particularly shown and described with reference to the illustrated embodiments, those skilled in the art will understand that changes in form and detail may be made without departing from the spirit and scope of the invention.

What is claimed is:

1. A method of making a vertical GaN-based LED, the method comprising:
   providing a sapphire substrate;

sequentially forming a u-GaN layer, a highly doped stop layer, an n-type GaN layer, an active layer, and a p-type GaN layer on the sapphire substrate, wherein the u-GaN layer, a highly doped stop layer, an n-type GaN layer, an active layer, and a p-type GaN layer are a plurality of layers;

forming a plurality of stop points in the plurality of layers;

forming a conductive substrate on the p-type GaN layer;

removing the sapphire substrate using mechanical thinning;

removing a part of the u-GaN layer using mechanical thinning, wherein the mechanical thinning stops at an end of the plurality of stop points;

selectively etching the u-type GaN layer and exposing at least a part of the highly doped stop layer;

removing the u-type GaN layer; and forming an n-electrode on the highly doped stop layer.

2. The method of claim 1, wherein the step of selectively etching the u-GaN layer is high selective photoelectrochemical (PEC) etching.

3. The method of claim 1, wherein the hardness of the plurality of stop points is greater than the hardness of the sapphire substrate.

4. The method of claim 1, wherein the highly doped stop layer is one or more layers of AlInGaN.

5. The vertical GaN-based LED of claim 4, wherein the composition of the AlInGaN is $Al_x In_y Ga_{(1-x-y)}N$.

6. The vertical GaN-based LED of claim 5, wherein x is less than or equal to approximately 0.35 and y is less than or equal to approximately 0.1.

7. The vertical GaN-based LED of claim 1, wherein the highly doped stop layer is one or more layers of AlGaN.

8. The vertical GaN-based LED of claim 7, wherein the composition of AlGaN is $Al_x Ga_{(1-x)}N$.

9. The vertical GaN-based LED of claim 8, wherein x is less than or equal to approximately 0.35.

10. The vertical GaN-based LED of claim 1, wherein the highly doped stop layer is a AlN/GaN super lattice structure.

11. The vertical GaN-based LED of claim 10, wherein the AlN/GaN super lattice structure includes two or more pairs of AlN and GaN layers.

* * * * *